(12) United States Patent
Wu et al.

(10) Patent No.: US 8,802,537 B1
(45) Date of Patent: Aug. 12, 2014

(54) SYSTEM AND METHOD FOR IMPROVING RELIABILITY IN A SEMICONDUCTOR DEVICE

(75) Inventors: Yider Wu, San Jose, CA (US); Unsoon Kim, San Jose, CA (US); Kuo-Tung Chang, Saratoga, CA (US); Harpreet Sachar, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/189,874

(22) Filed: Jul. 27, 2005

(51) Int. Cl.
*H01L 21/76* (2006.01)

(52) U.S. Cl.
USPC ............ 438/424; 438/221; 438/297; 438/426

(58) Field of Classification Search
USPC ........... 438/424, 426, 221, 297; 257/E21.546
See application file for complete search history.

(56) References Cited

U.S. PATENT DOCUMENTS

| | | | | |
|---|---|---|---|---|
| 5,641,705 | A * | 6/1997 | Ahn et al. | 438/448 |
| 5,712,185 | A * | 1/1998 | Tsai et al. | 438/424 |
| 5,719,085 | A * | 2/1998 | Moon et al. | 438/424 |
| 5,763,315 | A * | 6/1998 | Benedict et al. | 438/424 |
| 5,956,598 | A * | 9/1999 | Huang et al. | 438/424 |
| 6,027,982 | A * | 2/2000 | Peidous et al. | 438/424 |
| 6,141,242 | A * | 10/2000 | Hsu et al. | 365/182 |
| 6,204,127 | B1 * | 3/2001 | Wang | 438/270 |
| 6,225,171 | B1 * | 5/2001 | Yu et al. | 438/296 |
| 6,358,785 | B1 * | 3/2002 | Chittipeddi et al. | 438/174 |
| 6,372,606 | B1 * | 4/2002 | Oh | 438/435 |
| 6,391,729 | B1 * | 5/2002 | Hui | 438/296 |
| 6,541,351 | B1 * | 4/2003 | Bartlau et al. | 438/426 |
| 7,259,053 | B2 * | 8/2007 | Kim | 438/218 |
| 2002/0064943 | A1 * | 5/2002 | Iguchi et al. | 438/637 |
| 2006/0160322 | A1 * | 7/2006 | Buehrer et al. | 438/424 |
| 2007/0166904 | A1 * | 7/2007 | Teo et al. | 438/197 |

OTHER PUBLICATIONS

Stanley Wolf, Silicon Processing for VLSI Era, 2000, Lattice Press, vol. 1, pp. 128-130,488-489.*
Kern, W. Handbook of Semiconductor Wafer Cleaning Technology—Science, Technology, and Applications. William Andrew Publishing/Noyes. pp. 1-3 Online version available at: http://www.knovel.com/knovel2/Toc.jsp?BookID=132&VerticalID=0.*
2002 IEEE International Solid-State Circuits Conference, Session 6, "SRAM and Non-Volatile Memories," Feb. 4, 2004,6 pages.
2002 IEEE International Solid-State Circuits Conference, 23 pages.

* cited by examiner

*Primary Examiner* — Jarrett Stark
(74) *Attorney, Agent, or Firm* — Harrity & Harrity, LLP

(57) ABSTRACT

A method for forming a memory device is provided. A nitride layer is formed over a substrate. The nitride layer and the substrate are etched to form a trench. The memory device is pre-cleaned to prepare a surface of the memory device for oxide formation thereon, where cleaning the memory device removes portions of the barrier oxide layer on opposite sides of the trench. The nitride layer is trimmed on opposite sides of the trench. A liner oxide layer is formed in the trench.

12 Claims, 11 Drawing Sheets

SYSTEM AND METHOD FOR IMPROVING RELIABILITY IN A SEMICONDUCTOR DEVICE

TECHNICAL FIELD

The present invention relates generally to semiconductor manufacturing and, more particularly, to fabrication of memory devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells are erased together as a block.

Flash memory devices of this type may include individual memory cells characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

Memory cells in a flash memory device are typically connected in an array of rows and columns, with the control gates of the cells in a row being connected to a respective word line and the drains of the cells in a column being connected to a respective bit line. To operate efficiently and reliably, each cell is effectively isolated from neighboring cells.

As the dimensions of such memory devices have shrunk, isolation techniques have transitioned from conventional local oxidation of silicon ("LOCOS") isolation techniques to shallow trench isolation ("STI"). In fabricating an STI structure, a trench is created in the substrate between active regions of neighboring cells. The trench is filled with a field oxide (FOX) material that isolates neighboring cells from each other. During processing, the FOX material may be formed into a raised surface or platform (relative to the substrate) between neighboring isolation regions. This platform may be referred to as the "mesa" on which each memory cell in the flash memory device may be formed. Unfortunately, conventional STI fabrication techniques fail to provide suitable mesa widths.

DISCLOSURE OF THE INVENTION

In an implementation consistent with the principles of the invention, a method is provided for forming a memory device. A nitride layer is formed over a substrate. The nitride layer and the substrate are etched to form a trench. The memory device is pre-cleaned to prepare a surface of the memory device for oxide formation thereon, where cleaning the memory device removes portions of the barrier oxide layer on opposite sides of the trench. The nitride layer is trimmed on opposite sides of the trench. A liner oxide layer is formed in the trench.

In another implementation consistent with the principles of the invention, a memory device is provided. The memory device includes a substrate having at least one isolation trench formed therein, where an upper surface of a region of the substrate on opposite sides of the at least one isolation trench is substantially flat. A tunnel oxide is formed over the substrate. An oxide material is formed in the at least one isolation trench and includes a portion extending above an upper surface of the tunnel oxide, where the portion extending above the upper surface of the substrate forms a mesa having a width of at least 35 nm. A floating gate is formed over the tunnel oxide. A control gate is formed over the floating gate.

In yet another implementation consistent with the principles of the invention, a method is provided for forming a semiconductor device. The method includes forming a first oxide layer over a substrate; depositing a nitride layer over the first oxide layer; patterning a photoresist material to form a trench mask over the nitride layer; etching at least one isolation trench within the substrate, first oxide layer, and nitride layer; removing the trench mask; pre-cleaning the semiconductor device to remove portions of the first oxide layer on opposite sides of the at least one isolation trench; removing at least a portion of the nitride layer adjacent a sidewall of the at least one isolation trench, to widen a portion of the isolation trench; forming a second oxide layer in the at least one isolation trench; filling the at least one isolation trench with a third oxide material; and removing the nitride layer to form at least one mesa.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
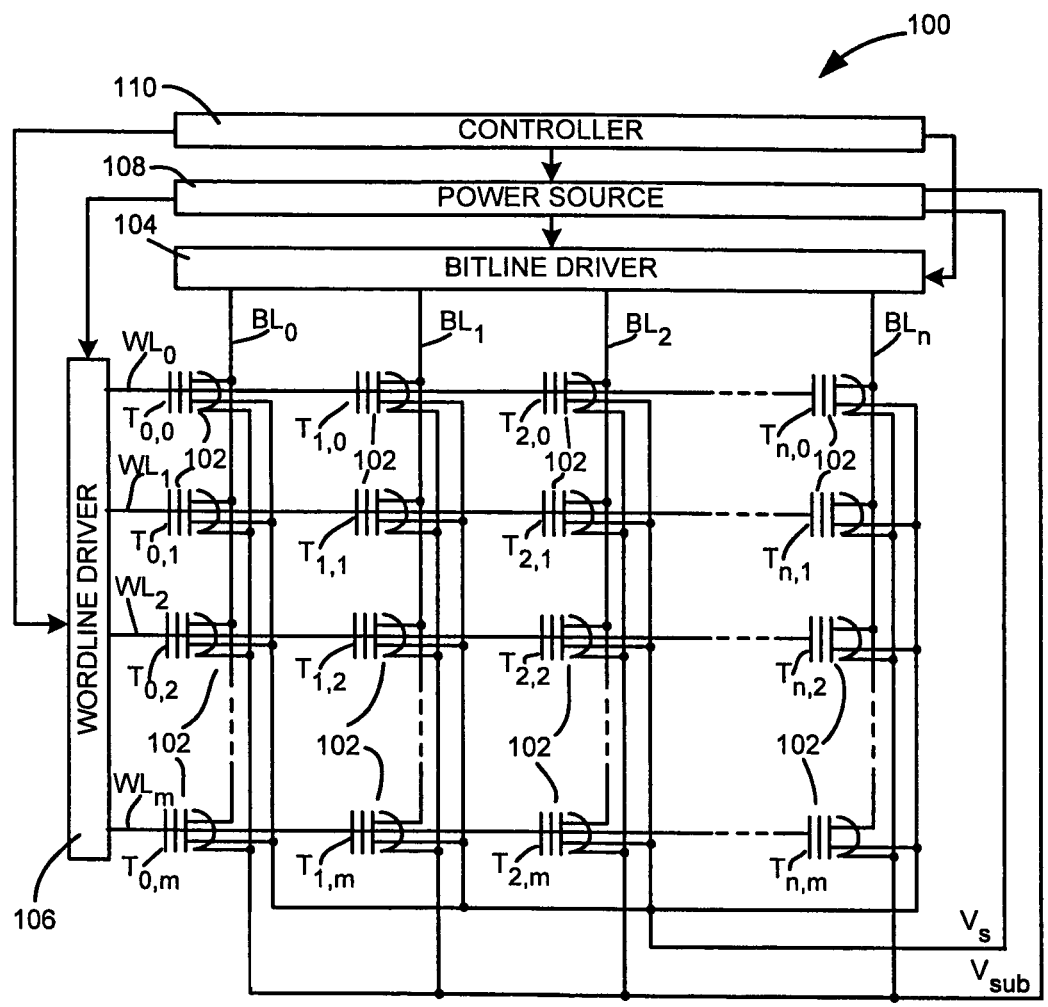
FIG. 1 illustrates an exemplary configuration of a flash EEPROM 100 formed in accordance with an embodiment of the invention.

Implementations consistent with principles of the invention provide non-volatile memory devices having improved field oxide mesa widths, such as flash electrically erasable programmable read only memory (EEPROM) devices. FIG. 1 illustrates an exemplary configuration of a flash EEPROM 100 formed in accordance with an embodiment of the invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_1$, and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. Controller 110 may also control drivers 104 and 106 to address the memory cells individually or collectively.

A memory cell 102 is located at each junction of a word line and a bit line. In one implementation, each cell 102 includes a Metal-Oxide-Semiconductor (MOS) Field Effect Transistor (FET) having a source and drain formed in a semiconductor substrate, a floating gate, and a control gate separated from the floating gate by an intergate dielectric. Additional details regarding the formation of cell 102 will be described below in relation to FIGS. 2A-17. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to power source 108.

In addition to a core memory array, as described above, a flash memory device may also include a peripheral microcontroller circuit formed on a portion of the flash memory device adjacent the core memory array. A number of transistors may be used in the peripheral circuit to produce the voltage required to program/erase the core memory cells.

Exemplary Processing

Figure 2A:
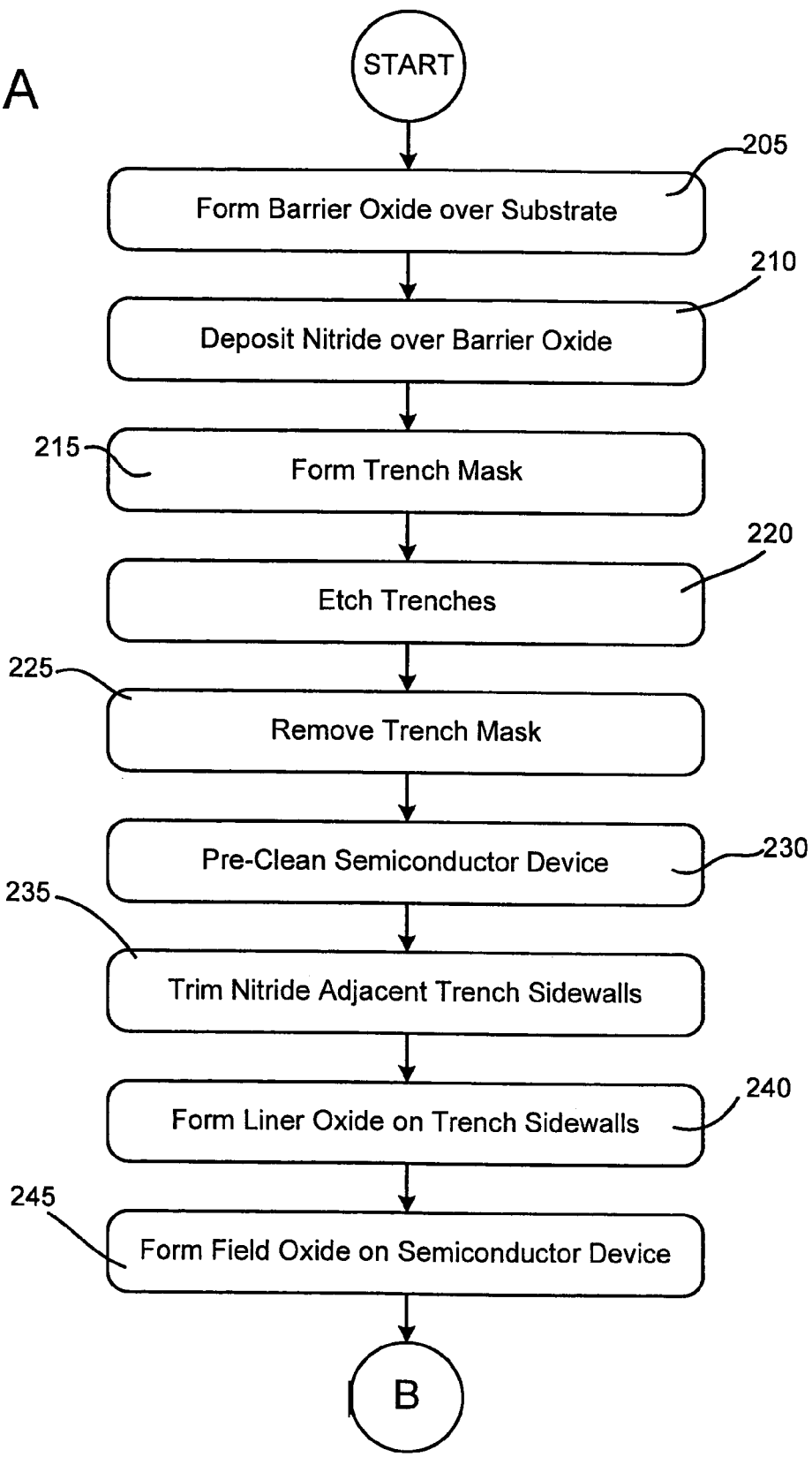
FIGS. 2A-2B are flow diagrams illustrating an exemplary process for forming a semiconductor memory device in an implementation consistent with the principles of the invention.
Figure 2B:
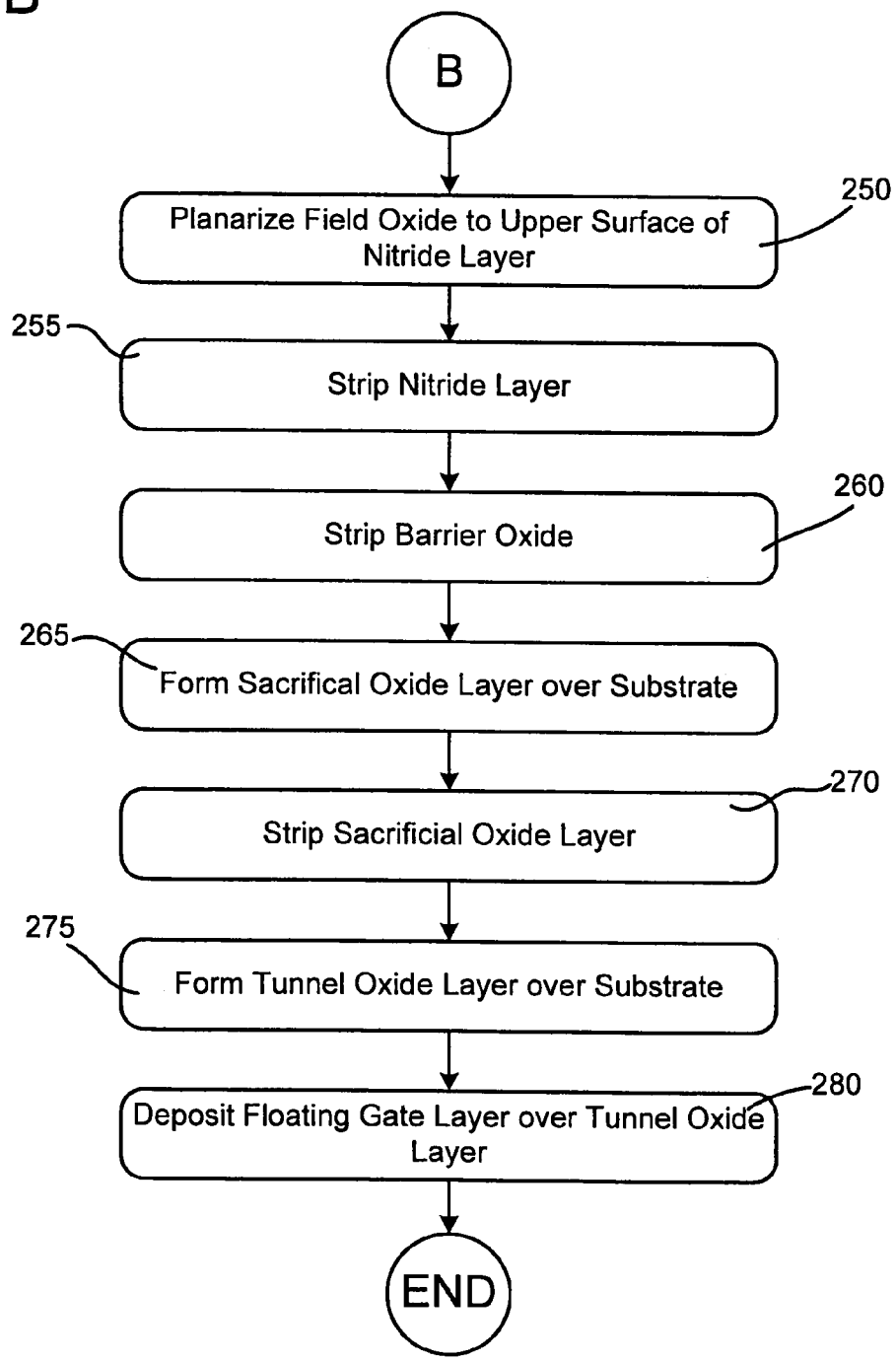

FIGS. 2A-2B illustrate an, exemplary process for forming a semiconductor memory device in an implementation consistent with the principles of the invention. In one implementation, the semiconductor memory device includes an array of memory cells of a flash memory device, such as that illustrated in FIG. 1. FIGS. 3-17 illustrate exemplary views of a semiconductor memory device fabricated according to the processing described in FIGS. 2A-2B.

Figure 3:
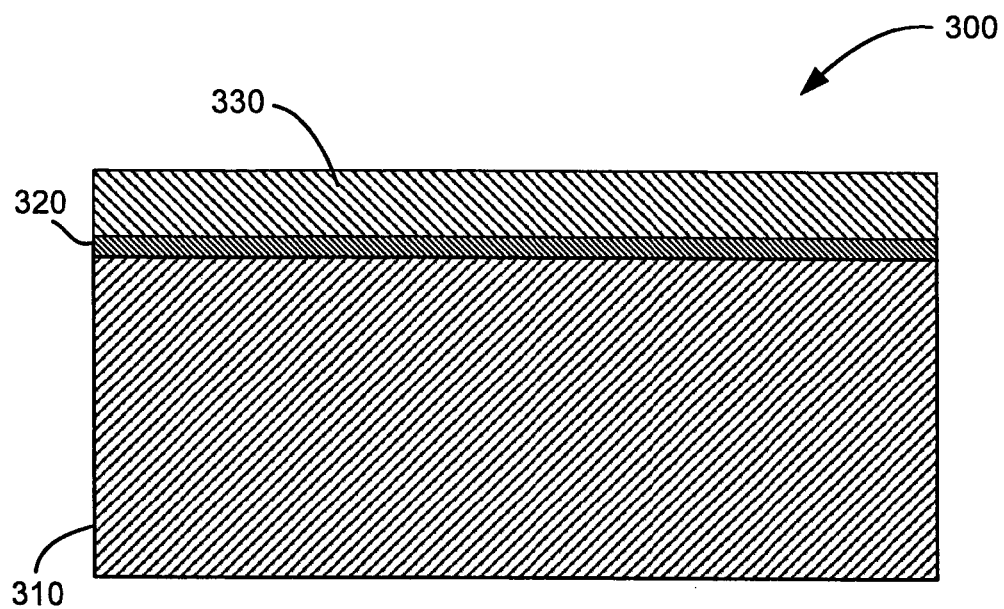
FIGS. 3-17 illustrate exemplary views of a semiconductor memory device fabricated according to the processing described in FIGS. 2A-2B.

With reference to FIGS. 2A and 3, processing may begin with a semiconductor device 300 that includes layers 310, 320, and 330. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a barrier oxide formed on layer 310 in a conventional manner (act 205). In an exemplary implementation, barrier oxide layer 320 may include an oxide, such as a silicon oxide (e.g., $SiO_2$), and may have a thickness ranging from about 50 Å to about 350 Å. In one implementation consistent with principles of the invention, a suitable method for forming layer 320 may be a thermal oxidation process of layer 310 at a temperature of about 750° C. to 950° C. Alternatively, barrier oxide layer 320 may be deposited using a low pressure chemical vapor deposition (LPCVD) process performed at a temperature of about 400° C. to 800° C.

Layer 330 may be a nitride layer formed on layer 320 in a conventional manner to act as a protective cap during subsequent etching processes (act 210). In an exemplary implementation, nitride layer 330 may include, for example, silicon nitride (e.g., $Si_3N_4$), and may have a thickness ranging from about 1000 Å to about 1700 Å. In one implementation consistent with principles of the invention, a suitable method for forming layer 330 may be chemical vapor deposition (CVD), although suitable alternative deposition techniques may also be employed.

Figure 4:
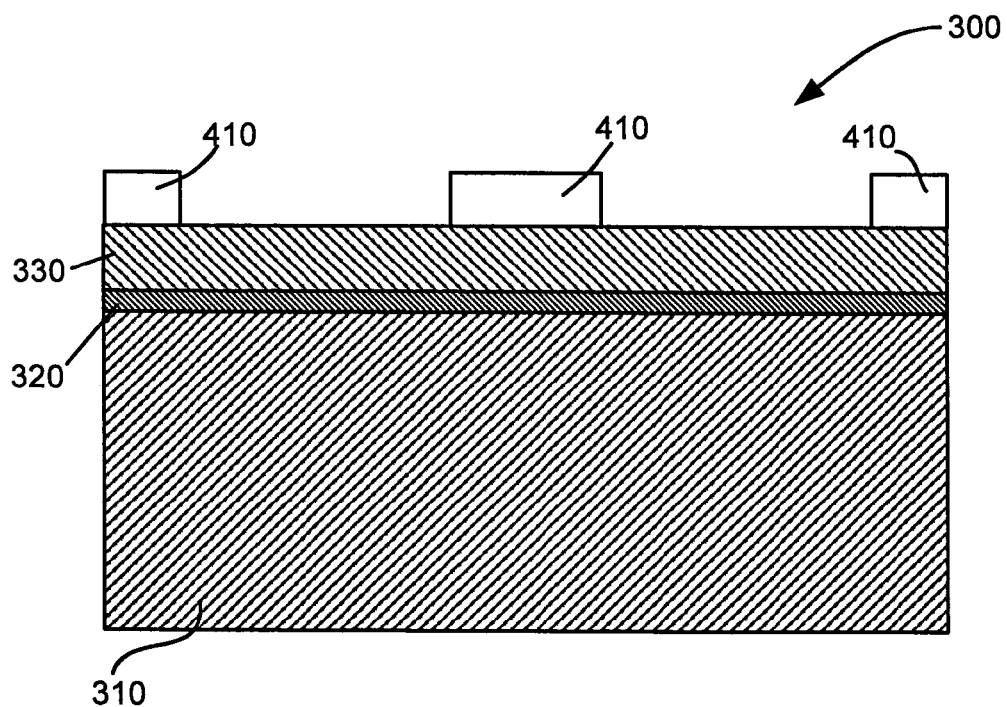
Figure 5:
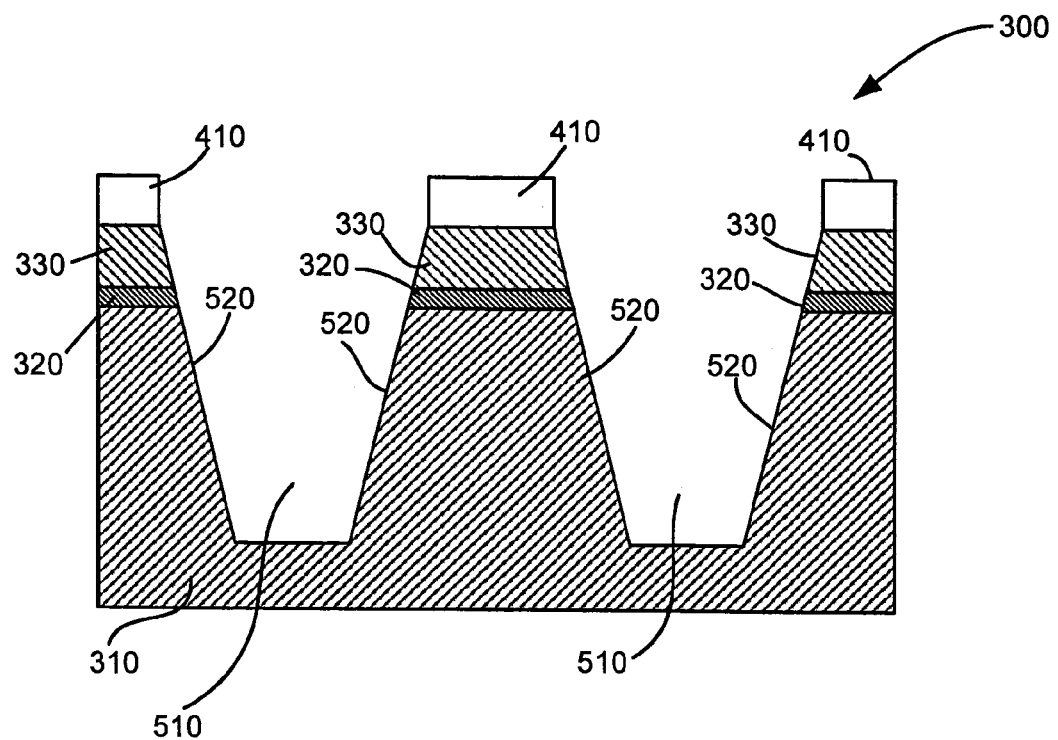
Figure 6:
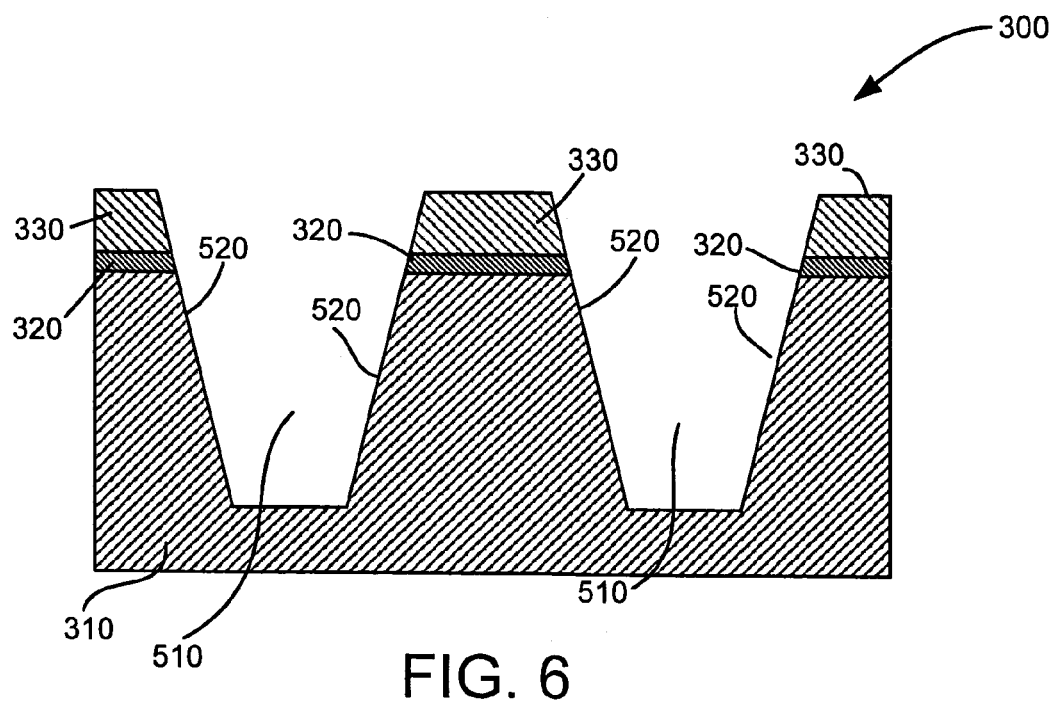

A photoresist material may be patterned and etched to form trench masks 410 on the top surface of layer 330, as illustrated in FIG. 4 (act 215). Trench masks 410 may be used to define active regions in the subsequently formed memory device and indicate areas that will not be etched during formation of core isolation regions in semiconductor device 300. Semiconductor device 300 may then be etched, as illustrated in FIG. 5, to remove portions of substrate 310, barrier oxide layer 320, and nitride layer 330 thereby forming shallow trenches 510 (act 220). The etch may also be referred to as a shallow trench isolation (STI) etch. In one implementation consistent with principles of the invention, trenches 510 may be formed to include sloping sidewalls 520 that slope inward from the upper surface of nitride layer 330. Trench masks 410 may then be removed (or cleaned), as illustrated in FIG. 6 (act 225). In one exemplary implementation, trench sidewalls 520 in nitride layer 330 may be separated by approximately 0.075 μm.

Figure 7:
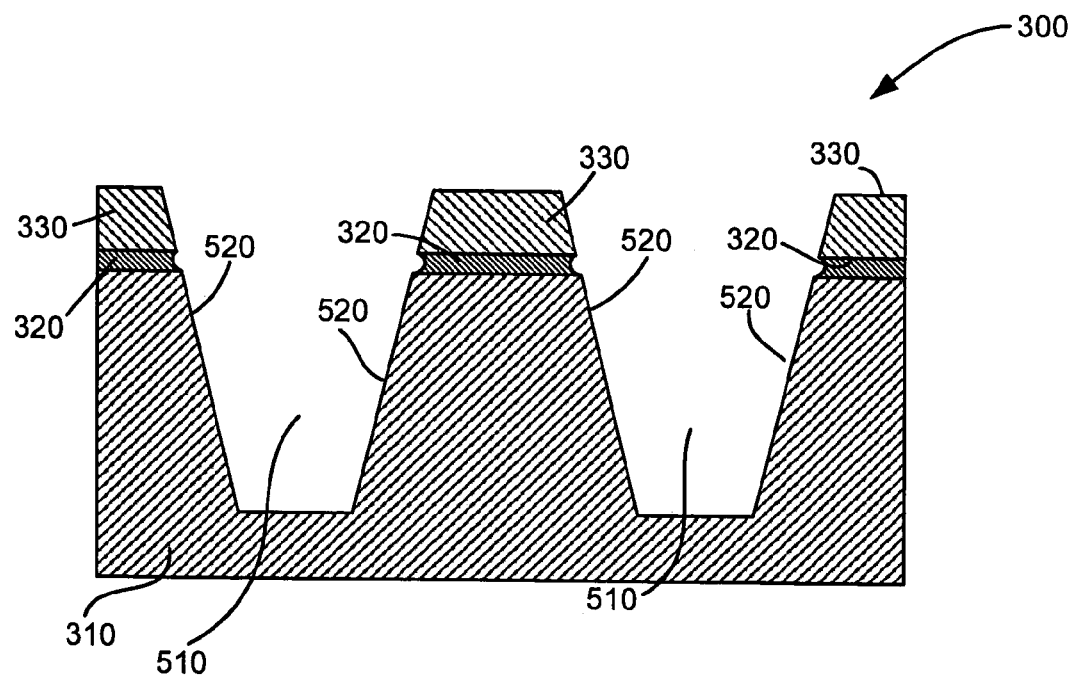

In accordance with one implementation consistent with principles of the invention, once masks 410 have been removed, semiconductor device 300 may be pre-cleaned to ready or prepare the exposed sidewalls 520 of trenches 510 for liner oxide deposition or oxidation (act 230). In one implementation consistent with principles of the invention, such pre-cleaning may include a wet chemical cleaning process for removing native oxide materials from trenches 510. Typical pre-cleaning processes may include a diluted hydrofluoric acid (HF) followed by a RCA clean process. An RCA clean process is a process developed by RCA Laboratories in 1970 for cleaning semiconductor devices. As shown in FIG. 7, during cleaning of device 300, portions of barrier oxide layer 320 may be removed so as to reduce the width of barrier oxide layer 320 between each trench 510. In one exemplary implementation, pre-cleaning of semiconductor device 300 results in removal of between about 10 Å to about 50 Å of the barrier oxide layer 320 from opposite sides of each trench 510.

Figure 8:
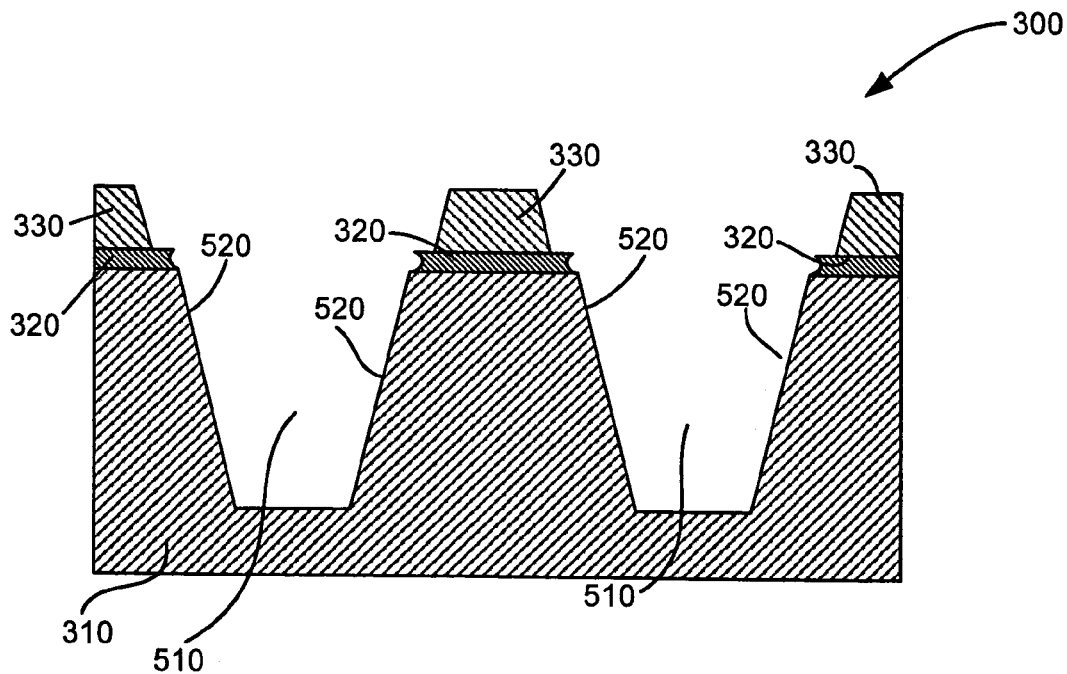

Once device 300 has been pre-cleaned, a portion of nitride layer 330 adjacent trench sidewalls 520 may be trimmed or removed, as shown in FIG. 8 (act 235). In an exemplary implementation, nitride layer 330 may be trimmed back approximately 100 Å to 350 Å from trench sidewall 520. In accordance with the above implementation, such trimming may result in a nitride layer trench separation of, for example, approximately 0.109 μm. That is, the side surfaces of nitride layer 330 may be approximately 0.10 μm from the sides of trench 510. It should be understood that in other implementations, this value may be smaller or greater. For example, the trench separation may range from about 0.05 μm to about 0.2 μm, based on the particular end device requirements. In one implementation consistent with principles of the invention, a suitable method for trimming nitride layer 330 may be a wet phosphoric acid etching that limits the etching to only the nitride material in layer 330 by a predetermined amount. Other suitable trimming or etching processes may also be used in a manner consistent with principles of the invention.

Figure 9:
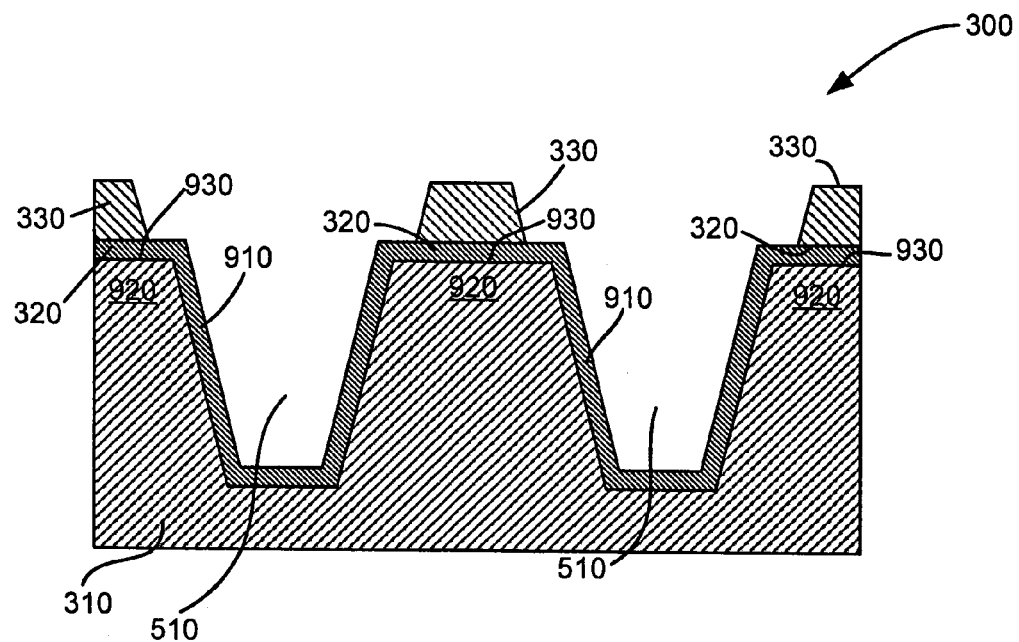

Following nitride layer 330 trimming, a liner oxide layer 910 may be formed on sidewalls 520 of trenches 510, as shown in FIG. 9 (act 240). In one exemplary implementation, liner oxide layer 910 may include an oxide, such as a silicon oxide (e.g., $SiO_2$), and may have a thickness ranging from about 50 Å to about 500 Å. In one implementation consistent with principles of the invention, a suitable method for forming layer 910 may be a thermal oxidation process of layer 310 at a temperature of about 950° C. to 1100° C. As shown in FIG. 9, by pre-cleaning device 300 prior to nitride trimming in act 235, the integrity of the regions 920 of layer 310 between trenches 510 may be preserved, thereby enhancing the reliability of semiconductor device 300. In one exemplary implementation, the above-described process results in upper surfaces 930 in regions 920 having a substantially flat configuration. This substantially flat surface enables the subsequently formed memory cells to achieve a more desirable profile that enhances device reliability and reduces leakage problems.

Figure 10:
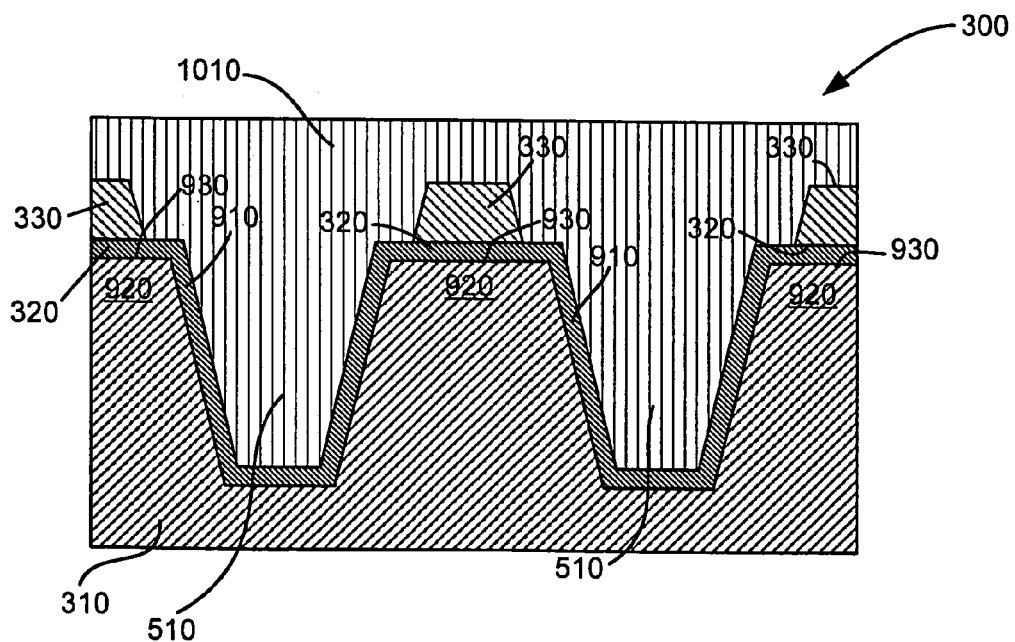

A field oxide (FOX) material 1010 may be formed on semiconductor device 300, as illustrated in FIG. 10 (act 245). In one implementation consistent with principles of the invention, FOX layer 1010 may be deposited by high density plasma chemical vapor deposition (HDP CVD), although suitable alternative deposition techniques may also be employed.

Figure 11:
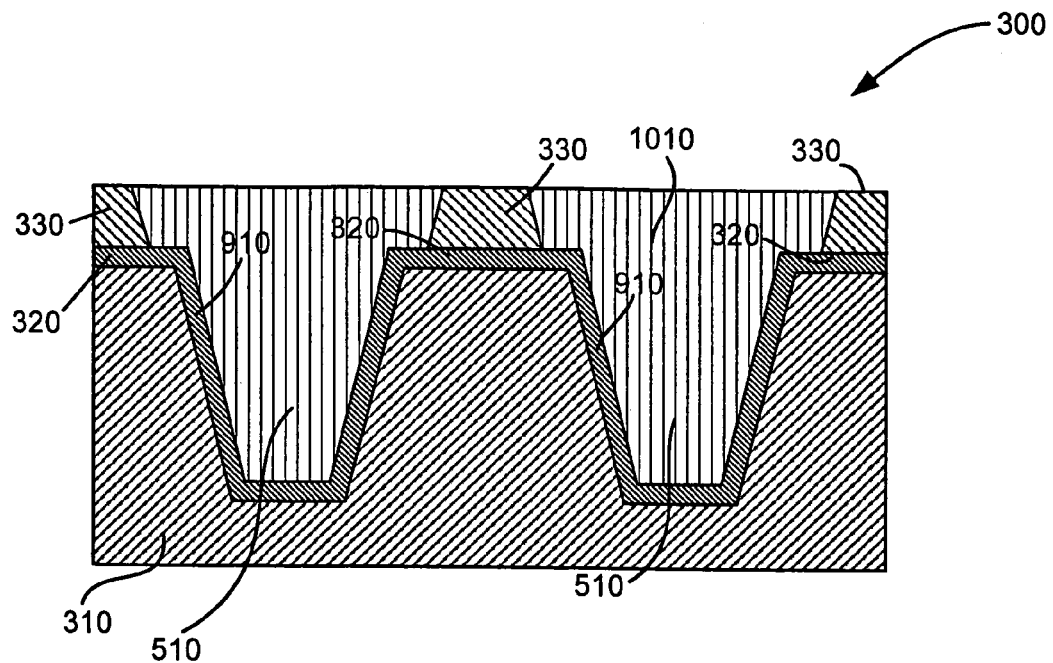
Figure 12:
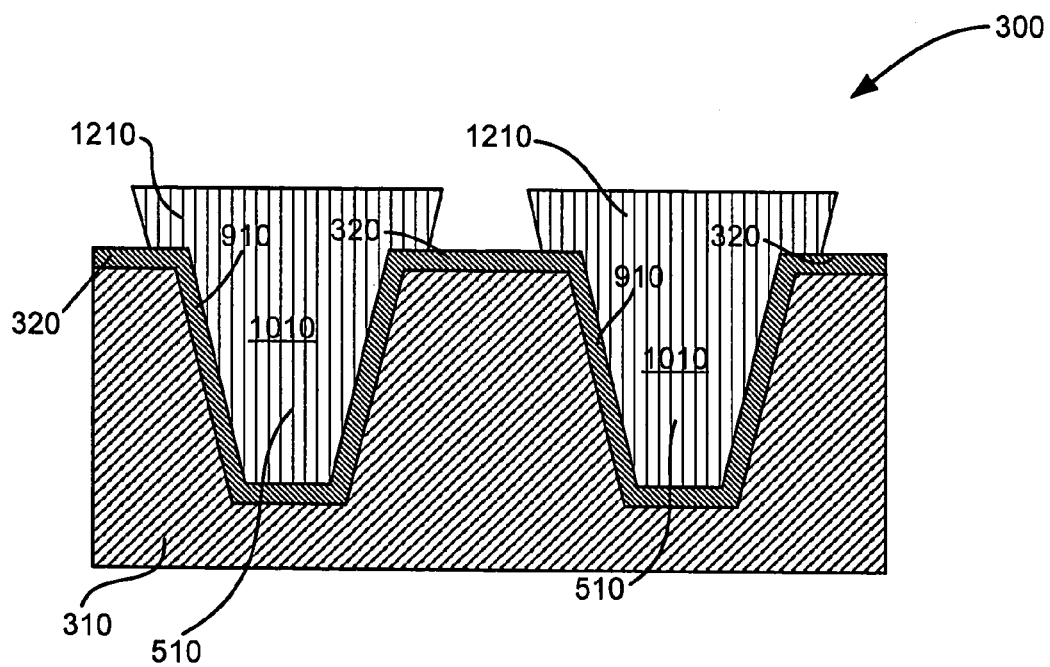

FOX layer 1010 may then be planarized using, for example, a chemical mechanical polishing (CMP) process to form a planar top surface aligned with a top surface of nitride layer 330, as illustrated, in FIG. 11 (act 250). Nitride layer 330 may then be stripped, as illustrated in FIG. 12 (act 255). In one exemplary implementation, a suitable method for stripping nitride layer 330 may be a wet phosphoric acid etching that limits the etching to only the nitride material in nitride layer 330. By stripping nitride layer 330, a portion of FOX layer 1010 remains extending above the top of trenches 510. These portions may be referred to as mesas 1210 formed over trenches 510.

Figure 13:
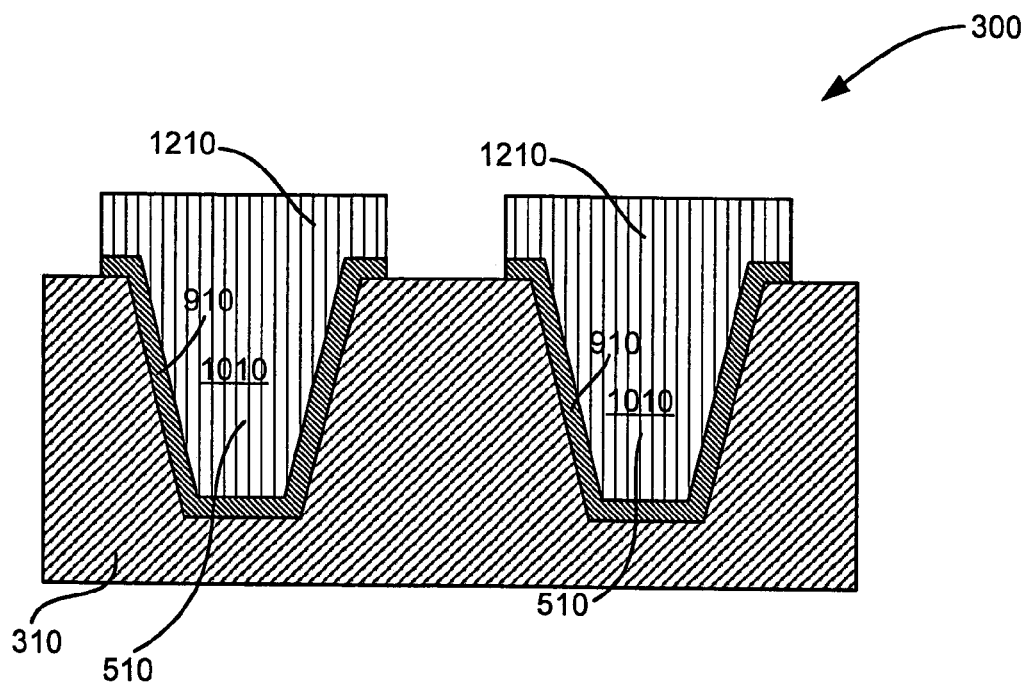
Figure 14:
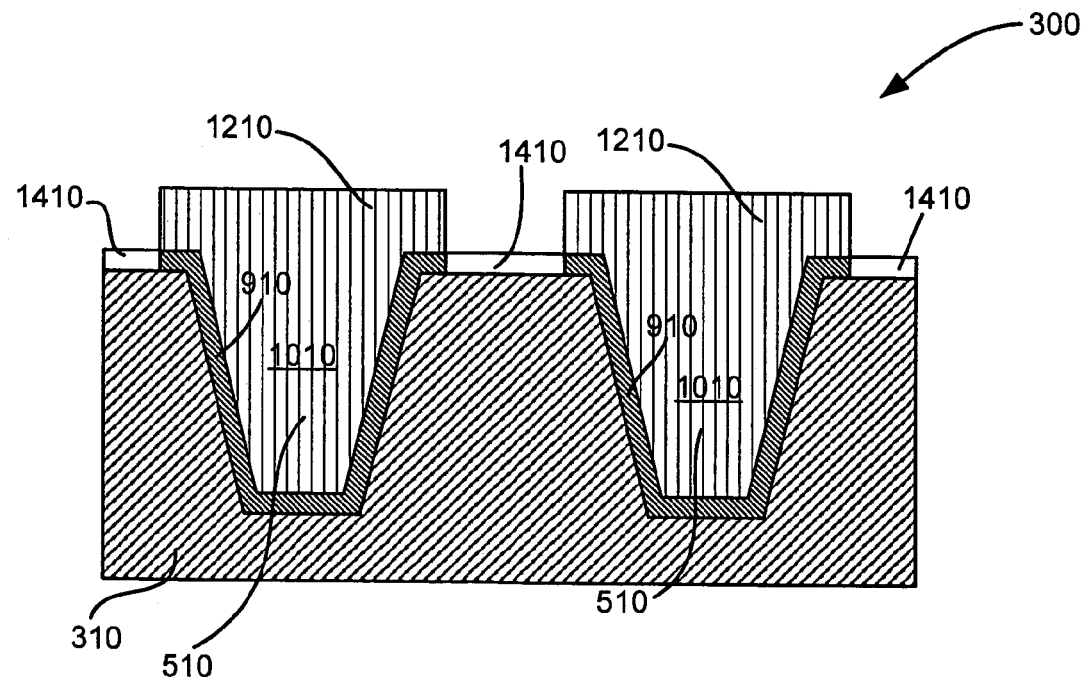
Figure 15:
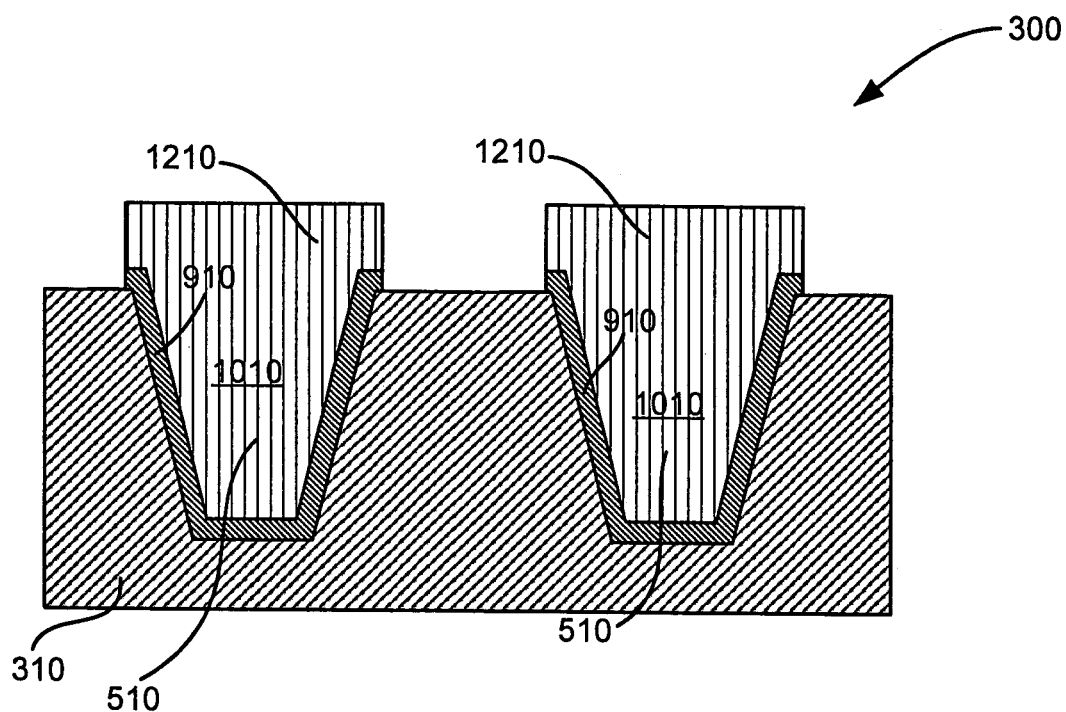

Barrier oxide layer 320 may then be stripped in a cleaning process, as shown in FIG. 13 (act 260). During the cleaning process, portions of FOX layer 1010 may be removed so as to reduce the width of mesas 1210. A sacrificial oxide layer 1410 may then be formed over substrate 310, as shown in FIG. 14 (act 265). Oxide layer 1410 may then be stripped or cleaned, as shown in FIG. 15 (act 270). As with the cleaning process of act 260, the cleaning of act 270 may also reduce the overall width of mesas 1210. In one implementation, due to the nitride trimming of act 235, along with the additional processing described above, mesas 1210 may have a finished width of at least 35 nanometers. For example, the width may range from about 35 nm to about 90 nm.

Figure 16:
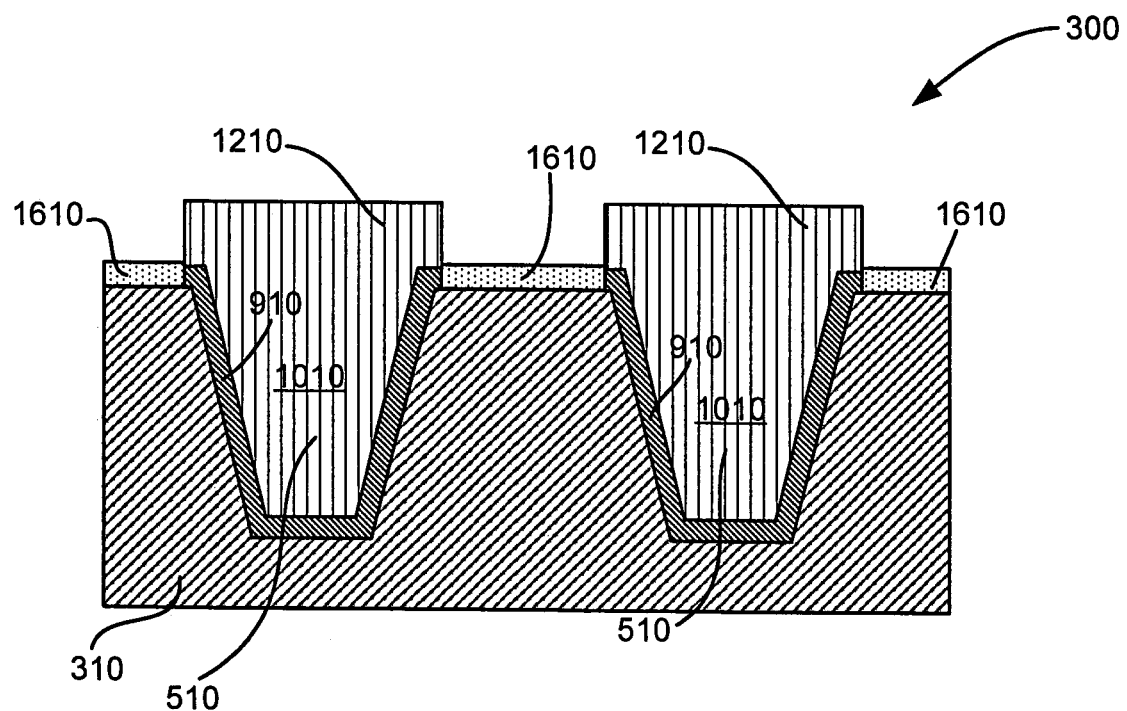

A dielectric layer 1610 may be formed on layer 310 in a conventional manner, as shown in FIG. 16 (act 275). In an exemplary implementation, dielectric layer 1610 may include an oxide, such as a silicon oxide (e.g., $SiO_2$), and may have a thickness ranging from about 50 Å to about 110 Å. Dielectric layer 1610 may function as a tunnel oxide layer for a subsequently formed memory cell of semiconductor device 300. In one implementation consistent with principles of the invention, a suitable method for forming layer 1610 may be thermal oxidation of layer 310 at a temperature of about 950° C. to 1100° C.

Figure 17:
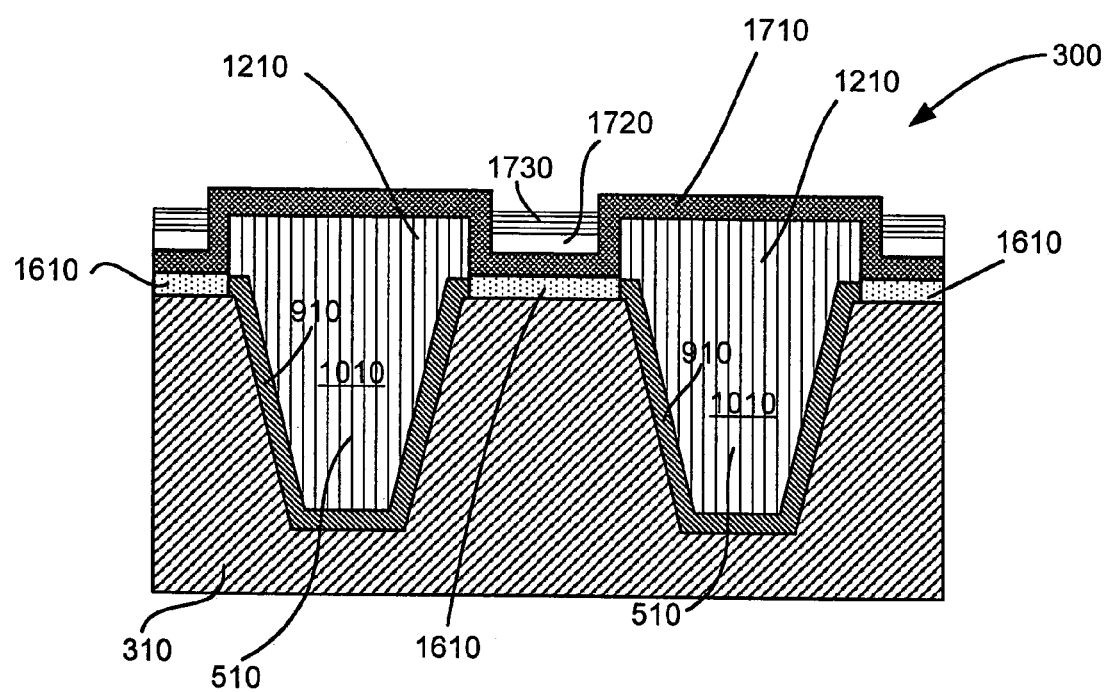

A layer 1710 may be formed on layer 1610 and mesas 1210 in a conventional manner and may include a material, such as polysilicon or silicon nitride, as shown in FIG. 17 (act 280). Layer 1710, consistent with principles of the invention, may act as a charge storage or floating gate layer for semiconductor device 300 and may have a thickness ranging from about 400 Å to about 900 Å. Following floating gate formation, suitable additional steps may also be performed in fabricating semiconductor device 300. For example, an intergate dielectric layer 1720, at least one control gate 1730, and source/drain regions may be formed in semiconductor device 300. Details regarding such processes are well within the scope of the art and will not be described in detail herein.

As illustrated, a semiconductor device is provided with a number of memory cells that each include a tunnel oxide layer and a floating gate, formed over a tunnel oxide layer and a number of field oxide mesas. By performing the processing, trimming of a nitride layer during formation of the field oxide mesas having a maximized mesa width may be achieved and device reliability may be substantially improved.

Conclusion

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 2A and 2B, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method for forming a memory device, the method comprising:
    forming a barrier oxide layer over a substrate;
    forming a nitride layer over the barrier oxide layer;
    etching the nitride layer, the barrier oxide layer and the substrate to form a trench,
        the trench including sidewalls that slope inward from an upper surface of the nitride layer;
    pre-cleaning the memory device to prepare an exposed surface of the sidewalls of the trench for oxide formation thereon,
        pre-cleaning the memory device including:

removing first portions of the barrier oxide layer on opposite sides of the trench to reduce a width of the barrier oxide layer,
  the first portions of the barrier oxide layer undercutting portions of the nitride layer;
trimming, after pre-cleaning the memory device, the nitride layer to remove portions of the nitride layer on opposite sides of the trench and to expose second portions of the barrier oxide layer on the opposite sides of the trench,
  the exposed second portions of the barrier oxide layer being adjacent to the sidewalls,
  a distance that the nitride layer is trimmed being less than a width of the nitride layer,
    the distance that the nitride layer is trimmed being between about 500 Å and about 2000 Å, and
    the width of the nitride layer being between about 1000 Å and about 1700 Å,
  trimming the nitride layer after pre-cleaning the memory device preserving an integrity of a region of the substrate adjacent to the sidewalls, and
  the first portions of the barrier oxide layer being different from the second portions of the barrier oxide layer;
forming a liner oxide layer on the sidewalls of the trench;
filling the trench with a field oxide material over the liner oxide layer;
planarizing the field oxide material to form a planar top surface that is aligned with a top surface of the trimmed nitride layer;
stripping the trimmed nitride layer to form a mesa from the field oxide material,
  the mesa extending above a top of the trench,
  stripping the trimmed nitride layer exposing third portions of the barrier oxide layer positioned beneath the nitride layer,
  the third portions of the barrier oxide layer being different from the first portions of the barrier oxide layer and the second portions of the barrier oxide layer; and
cleaning the memory device to strip the barrier oxide layer and to remove portions of the field oxide layer,
  removing the portions of the field oxide layer reducing a width of the mesa, and
  cleaning the memory device including:
    forming a fourth oxide layer on the substrate adjacent the mesa, and
    removing the fourth oxide layer,
      removing the fourth oxide layer reducing the reduced width of the mesa.

2. The method of claim 1, where cleaning the memory device includes:
  removing between about 10 Å and about 50 Å of the barrier oxide layer from each side of the trench in a lateral direction.

3. The method of claim 1, where pre-cleaning the memory device includes:
  cleaning the memory device with a diluted hydrofluoric acid solution; and
  performing an RCA clean process after cleaning the memory device with the diluted hydrofluoric acid solution.

4. The method of claim 1, where trimming the nitride layer on opposite sides of the trench includes:
  wet etching the nitride layer on the opposite sides of the trench using phosphoric acid,
    wet etching the nitride layer using the phosphoric acid limiting an etching to only a nitride material in the nitride layer by a predetermined amount.

5. The method of claim 1, further comprising:
  forming a tunnel oxide over the substrate;
  forming a charge storage element over the tunnel oxide;
  forming an intergate dielectric over the charge storage element; and
  forming a control gate over the intergate dielectric.

6. The method of claim 1, where cleaning the memory device prior to trimming the nitride layer results in an upper surface of the region of the substrate adjacent to the sidewalls having a substantially flat configuration.

7. A method for fabricating a semiconductor device, the method comprising:
  forming a first oxide layer over a substrate;
  depositing a nitride layer over the first oxide layer;
  patterning a photoresist material to form a trench mask over the nitride layer;
  etching at least one isolation trench within the substrate, first oxide layer, and nitride layer,
    the at least one isolation trench including sidewalls that slope inward from an upper surface of the nitride layer;
  removing the trench mask;
  pre-cleaning the semiconductor device to remove portions of the first oxide layer on opposite sides of the at least one isolation trench to reduce a width of the first oxide layer,
    the removed portions of the first oxide layer undercutting portions of the nitride layer, and
    the width of the first oxide layer being reduced less than a thickness of the first oxide layer;
  removing at least a portion of the nitride layer adjacent to the sidewalls of the at least one isolation trench, after pre-cleaning the semiconductor device, to widen a portion of the isolation trench,
    removing the at least the portion of the nitride layer adjacent to the sidewalls after pre-cleaning the semiconductor device preserving an integrity of a region of the substrate adjacent to the sidewalls;
  forming a second oxide layer on the sidewalls of the at least one isolation trench;
  filling the at least one isolation trench with a third oxide material;
  planarizing the third oxide material to form a planar top surface that is aligned with a top surface of the nitride layer;
  removing the nitride layer to expose remaining sections of the first oxide layer and to form at least one mesa,
    the at least one mesa extending above a top of the at least one trench; and
  cleaning the semiconductor device to strip the first oxide layer and to remove portions of the third oxide layer,
    removing the portions of the third oxide layer reducing a width of the at least one mesa, and
    cleaning the semiconductor device including:
      forming a fourth oxide layer on the substrate adjacent the at least one mesa, and
      removing the fourth oxide layer,
        removing the fourth oxide layer reducing the reduced width of the mesa.

8. The method of claim 7, where an upper surface of the region of the substrate adjacent the sidewalls, following formation of the second oxide layer, has a substantially flat configuration.

9. The method of claim 7, where cleaning the semiconductor device further includes:

removing between about 10 Å and about 50 Å of the first oxide layer from each side of the at least one isolation trench.

10. The method of claim 7, where cleaning the semiconductor device further includes:
cleaning the semiconductor device with a diluted hydrofluoric acid solution; and
performing an RCA clean process after cleaning the semiconductor device with the diluted hydrofluoric acid solution.

11. The method of claim 7, where removing at least a portion of the nitride layer includes:
removing between 100 Å and 350 Å of nitride from each side of the at least one trench.

12. The method of claim 7, further comprising:
forming a tunnel oxide over the substrate adjacent the at least one mesa;
forming a charge storage element over the tunnel oxide and the at least one mesa;
forming an intergate dielectric over the charge storage element; and
forming a control gate over the intergate dielectric.

* * * * *